(12) United States Patent
Hoilien

(10) Patent No.: US 8,461,661 B2
(45) Date of Patent: Jun. 11, 2013

(54) LOCOS NITRIDE CAPPING OF DEEP TRENCH POLYSILICON FILL

(75) Inventor: Noel Hoilien, Minneapolis, MN (US)

(73) Assignee: Polar Semiconductor, Inc., Bloomington, MN (US)

( * ) Notice: Subject to any disclaimer, the term of this patent is extended or adjusted under 35 U.S.C. 154(b) by 0 days.

(21) Appl. No.: 12/418,819

(22) Filed: Apr. 6, 2009

(65) Prior Publication Data

US 2010/0252905 A1   Oct. 7, 2010

(51) Int. Cl.
*H01L 21/70* (2006.01)

(52) U.S. Cl.
USPC .......................... 257/520; 257/506; 438/430

(58) Field of Classification Search
None
See application file for complete search history.

(56) References Cited

U.S. PATENT DOCUMENTS

| | | | |
|---|---|---|---|
| 4,635,090 A * | 1/1987 | Tamaki et al. | 257/513 |
| 4,825,277 A | 4/1989 | Mattox et al. | |
| 5,148,257 A * | 9/1992 | Kishi | 257/520 |
| 5,312,770 A | 5/1994 | Pasch | |
| 5,561,073 A * | 10/1996 | Jerome et al. | 438/404 |
| 5,578,851 A | 11/1996 | Hshieh et al. | |
| 5,646,052 A * | 7/1997 | Lee | 438/426 |
| 5,811,315 A * | 9/1998 | Yindeepol et al. | 438/405 |
| 5,911,109 A | 6/1999 | Razouk et al. | |
| 5,933,746 A | 8/1999 | Begley et al. | |
| 6,146,970 A | 11/2000 | Witek et al. | |
| 6,200,873 B1 | 3/2001 | Schrems et al. | |
| 6,252,277 B1 | 6/2001 | Chan et al. | |
| 6,350,661 B2 | 2/2002 | Lim et al. | |
| 6,404,007 B1 * | 6/2002 | Mo et al. | 257/324 |
| 6,762,447 B1 | 7/2004 | Mandelman et al. | |
| 6,855,581 B2 | 2/2005 | Roh et al. | |
| 6,967,136 B2 | 11/2005 | Akatsu et al. | |
| 6,995,449 B1 * | 2/2006 | Yin et al. | 257/520 |
| 7,015,086 B2 * | 3/2006 | Chang et al. | 438/218 |
| 7,075,145 B2 | 7/2006 | Williams et al. | |
| 7,221,035 B2 | 5/2007 | Chang et al. | |
| 7,291,541 B1 | 11/2007 | Foote | |
| 7,312,481 B2 | 12/2007 | Chen et al. | |

* cited by examiner

*Primary Examiner* — Evan Pert
*Assistant Examiner* — Andres Munoz
(74) *Attorney, Agent, or Firm* — Kinney & Lange, P.A.

(57) ABSTRACT

A polysilicon-filled isolation trench in a substrate is effective to isolate adjacent semiconductor devices from one another. A silicon nitride cap is provided to protect the polysilicon in the isolation trench from subsequent field oxidation. The cap has lateral boundaries that extend between the side boundaries of the polysilicon and the sidewalls of the trench. Subsequent field oxide regions formed adjacent to the trench establish a gap dimension from the substrate to a top surface of the field oxide regions adjacent to the polysilicon side boundaries that is no less than half of the field oxide thickness.

14 Claims, 1 Drawing Sheet

LOCOS NITRIDE CAPPING OF DEEP TRENCH POLYSILICON FILL

BACKGROUND

The present invention relates to the formation of isolation trenches between semiconductor devices, and more particularly to local oxidation of silicon (LOCOS) nitride capping of a polysilicon-filled isolation trench to achieve effective device isolation.

Fabrication of semiconductor devices often requires electrical isolation between adjacent devices. Particularly in high voltage applications, one way to provide such isolation is to form deep, polysilicon-filled trenches in the substrate between devices. This is achieved by etching a deep trench in the substrate, depositing oxide in the trench to line the trench wall, filling the remainder of the trench with polysilicon, and applying field oxide over the filled trench. However, the application of field oxide over the filled trench can result in a wedge of oxide penetrating seams in the polysilicon filling the trench, creating stress that degrades the performance of the trench isolated devices.

Some efforts have been made to protect the polysilicon filled isolation trench with a LOCOS nitride cap that covers the entire region of the isolation trench. While this provides protection against oxide penetrating seams of the polysilicon, it also causes the device footprint to expand by displacing the field oxide further outside of the isolation trench region, and/or can result in reduction of the electrical breakdown threshold of the isolation trench due to the formation of small gaps between the polysilicon trench fill and polysilicon stringers that form over the isolation trench.

It would be useful in the art to form polysilicon-filled isolation trenches in such a way as to provide good mechanical and electrical performance.

SUMMARY

The present invention relates, in one aspect, to a protection structure for an isolation trench in a substrate. The isolation trench has first and second opposite side walls, and is at least partially filled with polysilicon having first and second opposite side boundaries. The protection structure includes an oxide layer on the polysilicon and the substrate, and a silicon nitride cap on the oxide layer over the polysilicon. The silicon nitride cap has a first lateral boundary that extends no less than the first side boundary of the polysilicon and no further than the first side wall of the isolation trench, and has a second lateral boundary that extends no less than the second side boundary of the polysilicon and no further than the second side wall of the isolation trench.

The present invention relates, in another aspect, to an isolation trench in a substrate for isolating adjacent semiconductor devices. The isolation trench includes a trench in the substrate that has first and second opposite sidewalls, polysilicon material in the trench that has first and second side boundaries, an oxide layer lining the trench around the polysilicon and extending across the top of the polysilicon layer and the substrate, and first and second field oxide regions adjacent to the trench. The field oxide regions have a field oxide thickness and establish a gap dimension from the substrate to a top surface of the field oxide regions adjacent to a corresponding polysilicon side boundary that is no less than half of the field oxide thickness.

The present invention relates, in yet another aspect, to a method of forming an isolation trench filled with polysilicon in a substrate. The method includes forming the isolation trench in the substrate with first and second opposite side walls, lining the isolation trench with a first oxide layer, filling the oxide-lined isolation trench with polysilicon having first and second opposite side boundaries, forming a second oxide layer over the substrate and the polysilicon-filled isolation trench, forming a silicon nitride cap on the second oxide layer over the polysilicon-filled isolation trench, and applying field oxidation to form first and second field oxide regions adjacent to the polysilicon-filled trench. The silicon nitride cap has a first lateral boundary that extends no less than the first side boundary of the polysilicon and no further than the first side wall of the isolation trench, and has a second lateral boundary that extends no less than the second side boundary of the polysilicon and no further than the second side wall of the isolation trench. The field oxide regions have a field oxide thickness and establish a gap dimension from the substrate to a top surface of the field oxide regions adjacent to a corresponding polysilicon side boundary that is no less than half of the field oxide thickness.

DETAILED DESCRIPTION

Figure 1A:
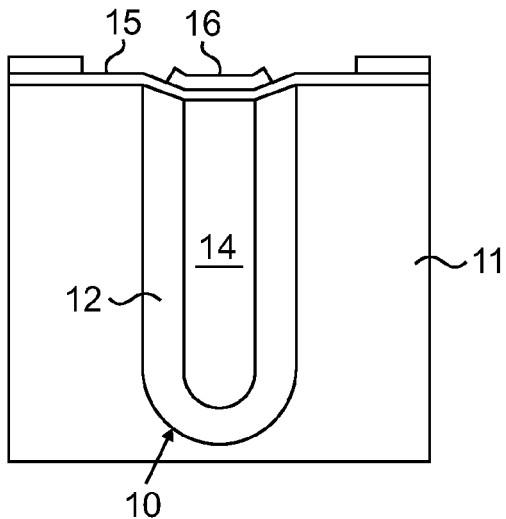
FIG. 1A is a diagram illustrating a polysilicon-filled isolation trench having a LOCOS nitride cap configured according to an embodiment of the present invention.

FIG. 1A is a diagram illustrating isolation trench 10 according to an embodiment of the present invention. Isolation trench 10 is formed in substrate 11, is lined with oxide 12, and is filled with polysilicon 14. In an exemplary embodiment, isolation trench 10 has a depth of at least 15 micrometers ($\mu$m), and oxide 12 has a thickness of about 500 nanometers (nm). Substrate 11 may be composed of silicon or another semiconductor material generally known in the art. A thin layer of oxide 15 is formed over substrate 11 and polysilicon 14. In an exemplary embodiment, oxide 15 has a thickness of about 20 nm. LOCOS nitride cap 16 is formed on top of oxide 15 over polysilicon 14. LOCOS nitride cap 16 covers at least the entire area of polysilicon 14, but no more than the entire area of isolation trench 10. The exposed areas of oxide 15 adjacent to LOCOS nitride cap 16 are the areas where field oxide may be applied, as will be discussed in more detail with respect to FIG. 1B.

Figure 1B:
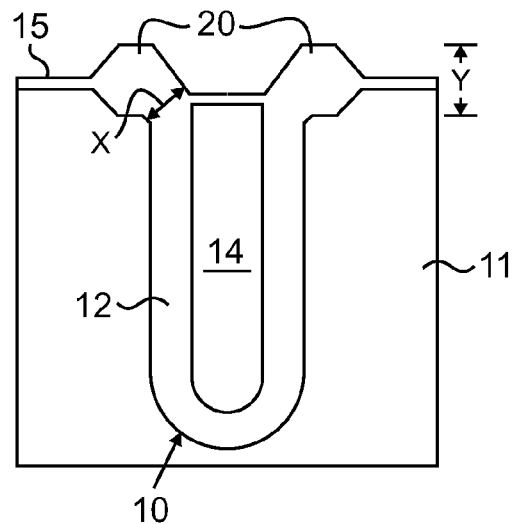
FIG. 1B is a diagram illustrating the application of field oxide to the polysilicon-filled and LOCOS nitride-capped isolation trench, after removal of the LOCOS nitride cap.

FIG. 1B is a diagram illustrating the application of field oxide 20 to isolation trench 10. With LOCOS nitride cap 16 in place to protect exposed polysilicon 14 filling trench 10, field oxide 20 is applied to the entire structure. Field oxide 20 only forms on exposed oxide 15, and does not form on LOCOS nitride cap 16, although oxidation occurs laterally in substrate 11 adjacent to isolation trench 10, as shown in FIG. 1B. As a result, regions of field oxide 20 are formed immediately adjacent to isolation trench 10, while ensuring that no field oxide is able to penetrate into any seams in polysilicon 14.

Figure 1C:
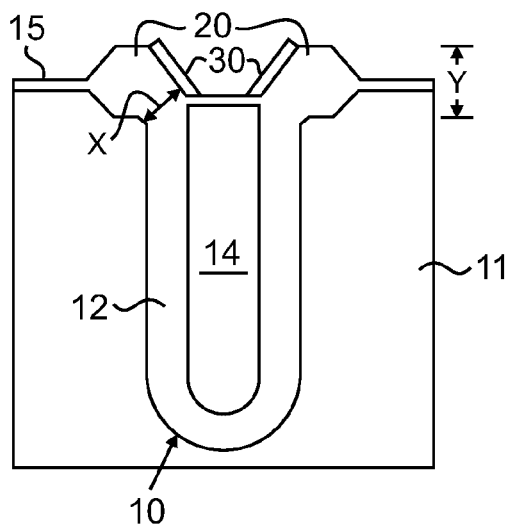
FIG. 1C is a diagram illustrating the location of polysilicon stringers on the field oxide over the isolation trench due to deposition of gate polysilicon on devices located adjacent to the isolation trench.

FIG. 1C is a diagram illustrating the location of polysilicon stringers 30 that form on field oxide 20 due to deposition of gate polysilicon on devices located adjacent to isolation trench 10. When gate polysilicon is formed on devices, it is deposited and then must be removed from areas where the gate polysilicon is not desired. Portions of the deposited gate polysilicon that cannot be removed are referred to as "stringers." It is known that polysilicon stringers 30 will form on field oxide 20 as shown in FIG. 1C. The configuration of field oxide 20 is therefore designed as shown to ensure that polysilicon stringers 30 do not create a relatively low breakdown voltage between regions of silicon substrate on opposite sides of isolation trench 10. As shown in FIG. 1C, dimension X from the surface of field oxide 20 to substrate 11 must be sufficiently large to prevent breakdown at voltages below a desired threshold. Dimension X represents the minimum distance between a corner of substrate 11 to the top of field oxide 20, which may occur in some embodiments in a different location than is shown in FIG. 1C. In an exemplary embodiment, where Y is the field oxide thickness (which, in an exemplary embodiment, is 400 nm, although the invention is applicable to a variety of field oxide thicknesses), this relationship is defined by the following equation:

$$\frac{X}{Y} \geq \frac{1}{2} \qquad \text{(Equation 1)}$$

The dimensions of LOCOS nitride cap 16 are critical to the ability of the present invention to simultaneously protect trench-filling polysilicon 14 from penetration by field oxide 20, to prevent the possibility of low voltage breakdown across isolation trench 10 due to small gaps between polysilicon stringers 30 and substrate 11, and to minimize the spacing between adjacent devices. Intuitively, it would seem that a large coverage area for LOCOS nitride cap 16 is desirable to ensure protection of isolation trench 10. However, if LOCOS nitride cap 16 is too large, a smaller gap is actually present between polysilicon stringers 30 and substrate 11, which can result in low voltage breakdown across isolation trench 10. Therefore, LOCOS nitride cap 16 must have a dimension that is no less than the size of polysilicon 14 filling isolation trench 10, but is no greater than the size of the side boundaries of isolation trench 10 formed in substrate 11 (see, e.g., FIG. 1A). This results in effective protection of polysilicon 14 from field oxide penetration while preventing small gaps between polysilicon stringers 30 and substrate 11.

FIGS. 1A, 1B and 1C have all labeled relatively thin oxide layer 15 over substrate 11 with the same reference numeral, for purposes of simplicity. However, in an exemplary embodiment, oxide layer 15 shown in FIGS. 1A and 1B represents LOCOS pad oxide (e.g., about 20 nm thick), while oxide layer 15 shown in FIG. 1C represents either thin gate oxide (e.g., about 12 nm thick) or thick gate oxide (e.g., about 20 nm thick).

Although the present invention has been described with reference to preferred embodiments, workers skilled in the art will recognize that changes may be made in form and detail without departing from the spirit and scope of the invention.

The invention claimed is:

1. A protection structure that protects an isolation trench, the isolation trench being formed in a substrate, the isolation trench having opposite first and second side walls and having polysilicon therein with opposite first and second outermost side boundaries adjacent the first and second side walls, respectively, such that the first outermost side boundary is nearer to the first side wall than the second side wall, and the second outermost side boundary is nearer to the second side wall than the first side wall, the protection structure comprising:
   an oxide layer on the polysilicon and the substrate; and
   a silicon nitride cap on the oxide layer over the polysilicon, the silicon nitride cap extending from a first outermost lateral boundary situated laterally between the first outermost side boundary of the polysilicon and the first side wall of the isolation trench, and the silicon nitride cap extending to a second outermost lateral boundary situated laterally between the second outermost side boundary of the polysilicon and the second side wall of the isolation trench.

2. The protection structure of claim 1, wherein the substrate is composed of silicon.

3. The protection structure of claim 1, wherein the isolation trench has a depth of at least 15 μm.

4. The protection structure of claim 1, wherein the isolation trench is lined with oxide material.

5. The protection structure of claim 4, further comprising:
   first and second field oxide regions adjacent to the isolation trench, the first and second field oxide regions having a field oxide thickness and establishing a gap dimension representing a minimum distance from the substrate at a corner of the isolation trench to a top surface of the first or second field oxide regions, wherein the gap dimension is no greater than the field oxide thickness, but no less than half of the field oxide thickness.

6. The protection structure of claim 5, wherein the substrate is composed of silicon.

7. The protection structure of claim 5, wherein the first and second field oxide regions extend toward the first and second outermost side boundaries, respectively, of the polysilicon at least as far as the first and second side walls, respectively, of the isolation trench in the substrate.

8. The protection structure of claim 5, wherein the first and second field oxide regions do not penetrate the polysilicon material in the isolation trench.

9. A method of forming an isolation trench filled with polysilicon in a substrate, the method comprising:
   forming the isolation trench in the substrate, the isolation trench having opposite first and second side walls;
   lining the isolation trench with a first oxide layer;
   filling the oxide-lined isolation trench with polysilicon having opposite first and second outermost side boundaries adjacent the first and second side walls, respectively, such that the first outermost side boundary is nearer to the first side wall than the second side wall, and the second outermost side boundary is nearer to the second side wall than the first side wall;
   forming a second oxide layer over the substrate and the polysilicon-filled isolation trench;
   forming a silicon nitride cap on the second oxide layer over the polysilicon-filled isolation trench, the silicon nitride cap extending from a first outermost lateral boundary situated laterally between the first outermost side boundary of the polysilicon and the first side wall of the isolation trench, and the silicon nitride cap extending to a second outermost lateral boundary situated laterally between the second outermost side boundary of the polysilicon and the second side wall of the isolation trench,
   applying field oxidation to form first and second field oxide regions adjacent to the polysilicon-filled trench, the field oxide regions having a field oxide thickness and establishing a gap dimension from the substrate to a top surface of the field oxide regions adjacent to a corresponding polysilicon outer side boundary that is no less than half of the field oxide thickness.

10. The method of claim 9, wherein forming the isolation trench in the substrate comprises forming the trench with a depth of at least 15 μm.

11. The method of claim 9, further comprising:
   removing the silicon nitride cap after applying the field oxidation.

12. The method of claim 9, wherein the first oxide layer lining the isolation trench is formed with a thickness of 500 nm.

13. The method of claim 9, wherein the second oxide layer over the substrate and the polysilicon-filled isolation trench is formed with a thickness of 20 nm.

14. The method of claim 9, wherein the field oxide thickness is 400 nm.

* * * * *